United States Patent
Chen

(10) Patent No.: US 9,627,449 B2
(45) Date of Patent: Apr. 18, 2017

(54) PIXEL ARRANGEMENT STRUCTURE FOR ORGANIC LIGHT-EMITTING DIODE DISPLAY

(71) Applicant: EverDisplay Optronics (Shanghai) Limited, Shanghai (CN)

(72) Inventor: Hung-Shun Chen, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/858,706

(22) Filed: Sep. 18, 2015

(65) Prior Publication Data

US 2016/0126298 A1    May 5, 2016

(30) Foreign Application Priority Data

Oct. 29, 2014   (CN) .......................... 2014 1 0597467

(51) Int. Cl.
    *H01L 27/32*    (2006.01)
(52) U.S. Cl.
    CPC ...... *H01L 27/3218* (2013.01); *H01L 27/3216* (2013.01)
(58) Field of Classification Search
    CPC . H01L 27/32; H01L 27/3211; H01L 27/3213; H01L 27/3216; H01L 27/3218
    See application file for complete search history.

(56) References Cited

U.S. PATENT DOCUMENTS

| 2006/0033422 | A1* | 2/2006 | Chao | H01L 27/3218 313/500 |
| 2008/0225143 | A1* | 9/2008 | Joffer | G09G 3/2003 348/280 |
| 2011/0019041 | A1* | 1/2011 | Ishiwata | H01L 27/14621 348/280 |
| 2014/0292622 | A1* | 10/2014 | Lee | G09G 3/3233 345/80 |

* cited by examiner

*Primary Examiner* — Phuc Dang
(74) *Attorney, Agent, or Firm* — Wang Law Firm, Inc.

(57) ABSTRACT

A pixel arrangement structure for an organic light-emitting diode display includes at least one first sub-pixel line having alternately disposed first and second sub-pixel units in a first direction. Each first sub-pixel unit includes four diagonally disposed red sub-pixels. Each second sub-pixel unit includes four diagonally disposed green sub-pixels. At least two second sub-pixel lines are respectively located on two sides of the first sub-pixel line. Each second sub-pixel line includes third sub-pixel units arranged in the first direction. Each third sub-pixel unit is located between one of the first sub-pixel units and one of the second sub-pixel units in a second direction perpendicular to the first direction and includes two blue sub-pixels arranged in the second direction. A red sub-pixel, a green sub-pixel, and a blue sub-pixel, which are adjacent to each other and which are respectively of the first sub-pixel line and the second sub-pixel line, form a pixel.

9 Claims, 4 Drawing Sheets

PIXEL ARRANGEMENT STRUCTURE FOR ORGANIC LIGHT-EMITTING DIODE DISPLAY

BACKGROUND OF THE INVENTION

The present invention relates to the field of organic light-emitting diodes and, more particularly, to a pixel arrangement structure for an organic light-emitting diode display.

In the flat panel display techniques, organic light-emitting diode (OLED) display panels are recognized as the third generation display technique following liquid crystal displays (LCD) due to the advantages of thin and light structure, active illumination, high speed response, large display area, rich colors and high luminance, low power consumption, and wide operating temperature range. Organic light-emitting diodes include passive matrix organic light-emitting diodes (PMOLEDs) and active matrix organic light-emitting diodes (AMOLEDs). PMOLEDs can only be used to produce small-size low-resolution display panels. Since AMOLEDs can be driven by integrating a thin-film transistor (TFT) and a capacitor in each pixel and by using the capacitor to maintain the voltage, AMOLEDs can be used to produce large-size high-resolution panels and are the current key research field and the developing trend of future display techniques.

FIGS. 1 and 2 show two examples of conventional pixel arrangement structures for organic light-emitting diode displays. Each pixel arrangement structure includes a plurality of pixels 90 arranged in a repeated manner. Each pixel 90 includes a red sub-pixel 91, a green sub-pixel 92, and a blue sub-pixel 93. The red sub-pixel 91, the green sub-pixel 92, and the blue sub-pixel 93 are square and adjacent to each other and are arranged in a regular pattern. However, it is difficult for the conventional OLEDs to meet the requirements of high resolution and high luminance of the displays of electronic devices. This is because it is difficult to deposit organic illuminating materials with metal masks in the conventional pixel arrangement structure of bar-shaped arrangement when the resolution of the OLED is above 300 PPI (pixel per inch). Furthermore, a compromise between the luminance and the service life is required, because the current density injected into the OLED is large due to the low aperture ratio. Although a PenTile pixel arrangement structure of a higher efficiency has been proposed, it suffers disadvantages of vision crosstalk, obvious Moiré effect, and aggregation of zigzag problems of slant lines.

BRIEF SUMMARY OF THE INVENTION

In view of the foregoing disadvantages, the present invention provides a pixel arrangement structure for an organic light-emitting diode display. The pixel arrangement structure for an organic light-emitting diode (OLED) display according to the present invention includes:

at least one first sub-pixel line comprising a plurality of first sub-pixel units and second sub-pixel units, each of the first sub-pixel units and second sub-pixel units arranged alternately in a first direction, wherein each of the first sub-pixel units comprises four red sub-pixels in matrix and four green sub-pixels in matrix; and at least two second sub-pixel lines respectively arranged in two parallel sides of the first sub-pixel line, wherein each of the two second sub-pixel lines comprises a plurality of third sub-pixel units arranged in the first direction, and each of the third sub-pixel units is arranged between the one of the first sub-pixel units and one of the second sub-pixel units in a second direction which is vertical to the first direction, and each of the third sub-pixel units comprises two adjoined blue sub-pixels arranged in the second direction, wherein a pixel unit is consisted by any three adjacent red sub-pixel, green sub-pixel and blue sub-pixel of the first sub-pixel line and one of the second sub-pixel lines.

In the pixel arrangement structure for an OLED display according to the present invention, the sub-pixels of the same color are closely arranged to form a sub-pixel group, and sub-pixel groups are arranged to be spaced from each other such that each three adjacent sub-pixels comprised of a red sub-pixel, a green sub-pixel, and a blue sub-pixel together form a pixel. In comparison with conventional techniques using a single sub-pixel, given the same resolution (ppi) of the OLED display screen, gathering a plurality of sub-pixels into a sub-pixel group can increase the aperture ratio of metal masks (fine metal masks), solving the difficulties in the process using metal masks. Alternatively, given the same aperture ratio of the masks, each sub-pixel in a sub-pixel group can be made smaller to increase the resolution of the OLED display screen.

The first direction can be the column direction, and the second direction can be the row direction.

Alternatively, the first direction can be the row direction, and the second direction can be the column direction.

Each of the plurality of first sub-pixel units, the plurality of second sub-pixel units, and the plurality of third sub-pixel units can be a polygon having a plurality of even-numbered sides.

Each of the plurality of first sub-pixel units, the plurality of second sub-pixel units, and the plurality of third sub-pixel units can be quadrangular, hexagonal, octagonal, elliptic, or circular.

By arranging each of the plurality of first sub-pixel units, the plurality of second sub-pixel units, and the plurality of third sub-pixel units to be quadrangular, hexagonal, octagonal, elliptic, or circular, the arrangement between the sub-pixels of each sub-pixel unit can be more compact and matched.

In another aspect, a pixel arrangement structure for an organic light-emitting diode display according to the present invention includes four pixel groups. Each of the four pixel groups includes a first sub-pixel, a second sub-pixel, and a third sub-pixel. The first, second, and third sub-pixels are arranged triangularly. The second pixels or the third sub-pixels of the four pixel groups are connected to each other. The first, second, and third sub-pixels have different colors. The second sub-pixels or the third sub-pixels connected to each other together form a polygon having a plurality of even-numbered sides.

In an example, the four pixel groups include first, second, third, and fourth pixel groups. When the second sub-pixels of the four pixel groups are connected to each other, the third sub-pixels of the first and second pixel groups are connected to each other, and the third sub-pixels of the third and fourth pixel groups are connected to each other.

In another example, the four pixel groups include first, second, third, and fourth pixel groups. When the third sub-pixels of the four pixel groups are connected to each other, the second sub-pixels of the first and second pixel groups are connected to each other, and the second sub-pixels of the third and fourth pixel groups are connected to each other.

Each first sub-pixel can be a blue sub-pixel, each second sub-pixel can be a red sub-pixel, and each third sub-pixel can be a green sub-pixel.

The present invention will become clearer in light of the following detailed description of illustrative embodiments of this invention described in connection with the drawings.

DETAILED DESCRIPTION OF THE INVENTION

A pixel arrangement structure for an organic light-emitting diode (OLED) display according to the present invention includes a first sub-pixel unit comprised of a plurality of red sub-pixels, a second sub-pixel unit comprised of a plurality of green sub-pixels, and a third sub-pixel unit comprised of a plurality of blue sub-pixels. The first, second, and third sub-pixel units are spaced from each other, such that one of the red sub-pixels, one of the green sub-pixels, and one of the blue sub-pixels, which are adjacent to each other, together form a pixel.

Each of the first, second, and third sub-pixel units is a polygon having even-numbered sides, an ellipse, or a circle, preferably a quadrangle, a hexagon, or an octagon, more preferably a regular quadrangle, a regular hexagon, or a regular octagon. Thus, the arrangement between the sub-pixels of each sub-pixel unit can be more compact and matched.

Specifically, a pixel arrangement structure for an OLED display according to the present invention includes:

at least one first sub-pixel line comprising a plurality of first sub-pixel units and second sub-pixel units, each of the first sub-pixel units and second sub-pixel units arranged alternately in a first direction, wherein each of the first sub-pixel units comprises four red sub-pixels in matrix and four green sub-pixels in matrix; and at least two second sub-pixel lines respectively arranged in two parallel sides of the first sub-pixel line, wherein each of the two second sub-pixel lines comprises a plurality of third sub-pixel units arranged in the first direction, and each of the third sub-pixel units is arranged between the one of the first sub-pixel units and one of the second sub-pixel units in a second direction which is vertical to the first direction, and each of the third sub-pixel units comprises two adjoined blue sub-pixels arranged in the second direction, wherein a pixel unit is consisted by any three adjacent red sub-pixel, green sub-pixel and blue sub-pixel of the first sub-pixel line and one of the second sub-pixel lines.

Specific embodiments of the pixel arrangement structure for an OLED display according to the present invention will now be set forth in connection with the accompanying drawings.

Embodiment 1

Figure 1:
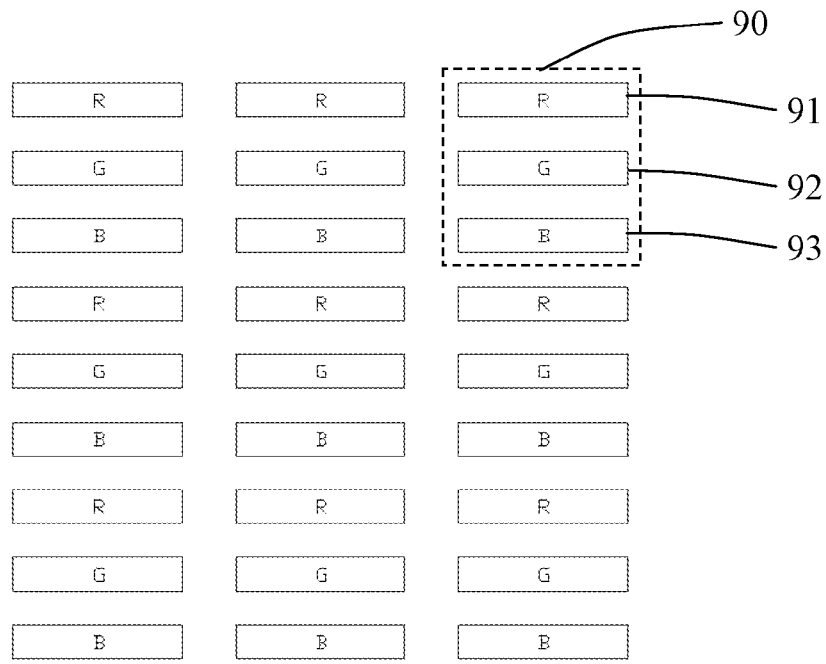
FIG. 1 is a diagrammatic view of a conventional pixel arrangement structure for an organic light-emitting diode display.
Figure 2:
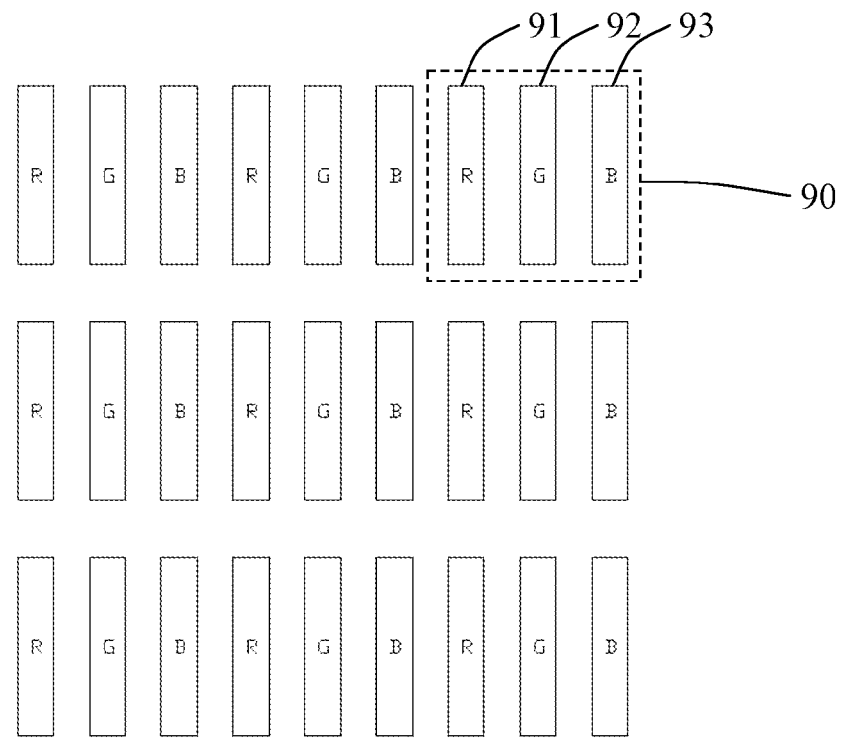
FIG. 2 is a diagrammatic view of another conventional pixel arrangement structure for an organic light-emitting diode display.
Figure 3:
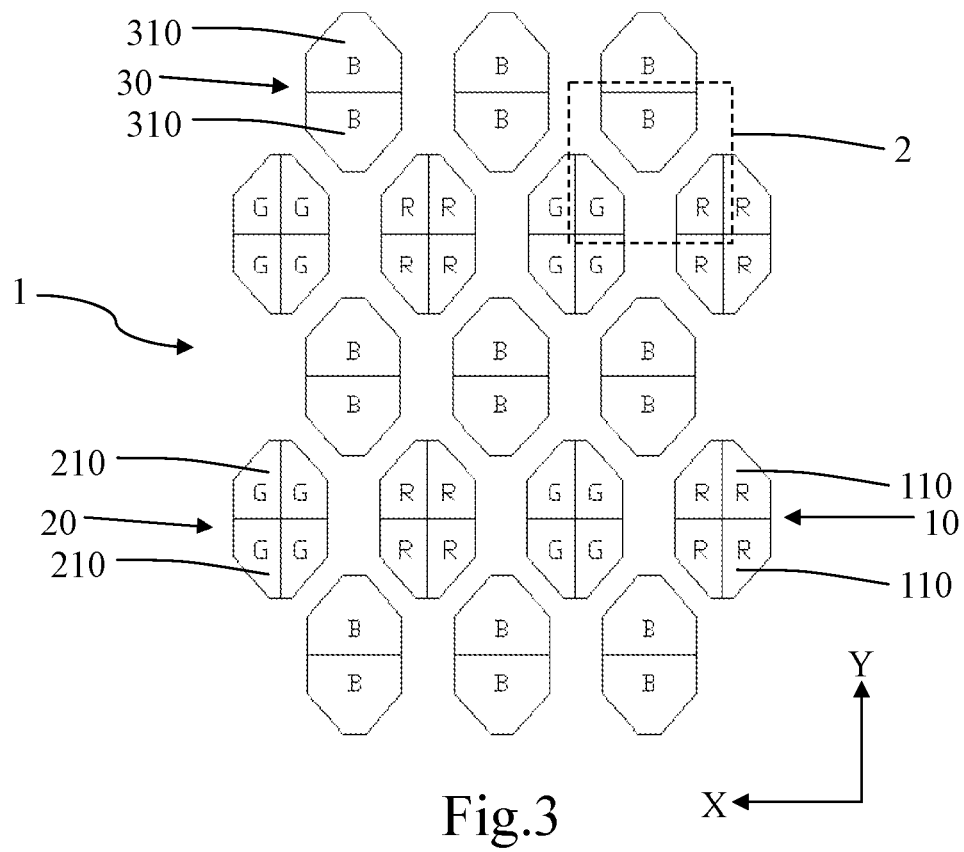
FIG. 3 is a diagrammatic view of a pixel arrangement structure for an organic light-emitting diode display of a first embodiment according to the present invention.

FIG. 3 is a diagrammatic view of a pixel arrangement structure 1 for an OLED display of the first embodiment according to the present invention. In the first embodiment, the first direction is the column direction (X direction), and the second direction is the row direction (Y direction). In this embodiment, the pixel arrangement structure 1 for an OLED display includes:

at least one first sub-pixel line including a plurality of first sub-pixel units 10 and a plurality of second sub-pixel units 20 spaced from the plurality of sub-pixel units 10, with the plurality of first sub-pixel units 10 and the plurality of second sub-pixel units 20 alternately disposed, with each of the plurality of first sub-pixel units 10 including four diagonally disposed red sub-pixels 110, and with each of the plurality of second sub-pixel units 20 including four diagonally disposed green sub-pixels 210; and at least two second sub-pixel lines respectively located on two sides of the at least one first sub-pixel line, with each of the at least two second sub-pixel lines including a plurality of third sub-pixel units 30, with each of the plurality of third sub-pixel units 30 located between a first sub-pixel unit 10 and a second sub-pixel unit 20 adjacent to the first sub-pixel unit 10 in the row direction, with each of the plurality of third sub-pixel units 30 including two blue sub-pixels 310 arranged in the row direction. In the embodiment shown in FIG. 3, each of the first, second, and third sub-pixel units 10, 20, and 30 is substantially a regular hexagon.

A red sub-pixel 110, a green sub-pixels 210, and a blue sub-pixel 310, which are adjacent to each other and which are respectively of the at least one first sub-pixel line and the at least two second sub-pixel lines, form a pixel 2.

Figure 4:
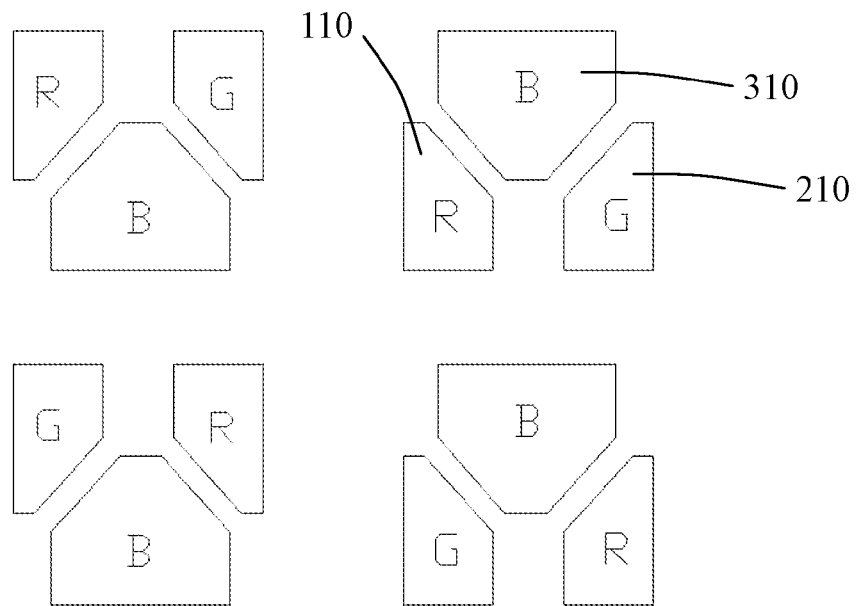
FIG. 4 is a diagrammatic view illustrating four combinations of a pixel of the pixel arrangement structure of FIG. 3.

With reference to FIG. 4, in the embodiment shown in FIG. 3, each pixel 2 of the pixel arrangement structure 1 includes a red sub-pixel 110, a green sub-pixels 210, and a blue sub-pixel 310. Furthermore, the red sub-pixel 110, the green sub-pixels 210, and the blue sub-pixel 310 of each pixel 2 together form a substantially T-shaped or inverted T-shaped structure.

Second Embodiment

Figure 5:
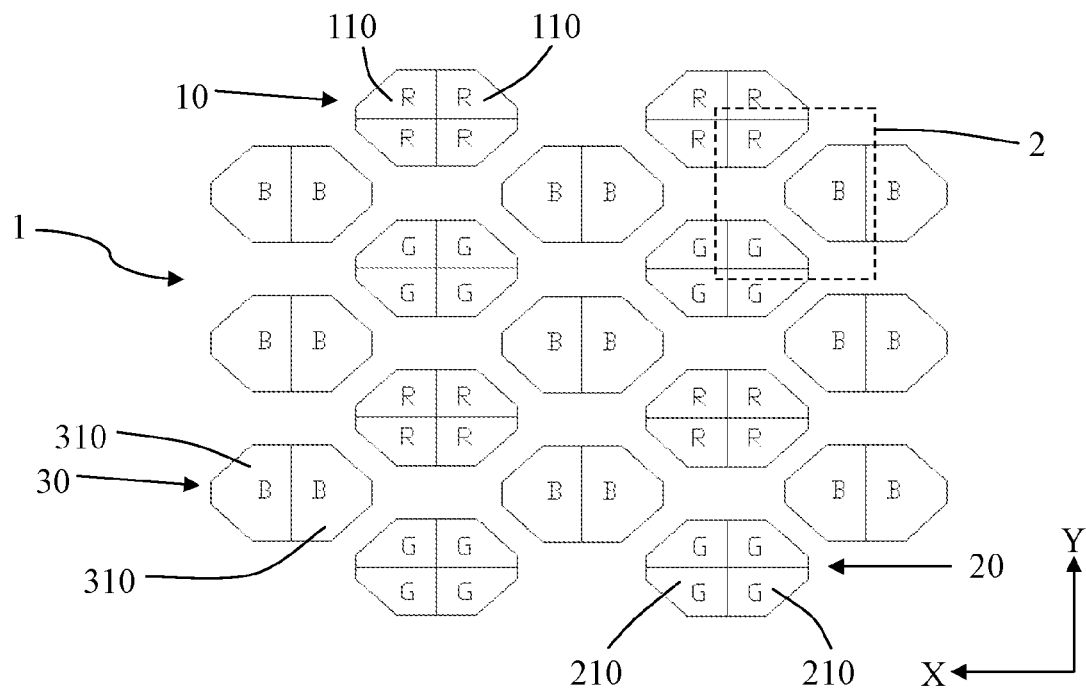
FIG. 5 is a diagrammatic view of a pixel arrangement structure for an organic light-emitting diode display of a second embodiment according to the present invention.

FIG. 5 is a diagrammatic view of a pixel arrangement structure 1 for an OLED display of the second embodiment according to the present invention. In the second embodiment, the first direction is the row direction (Y direction), and the second direction is the column direction (X direction). In this embodiment, the pixel arrangement structure 1 for an OLED display includes:

at least one first sub-pixel line including a plurality of first sub-pixel units 10 and a plurality of second sub-pixel units 20 spaced from the plurality of sub-pixel units 10, with the plurality of first sub-pixel units 10 and the plurality of second sub-pixel units 20 alternately disposed, with each of the plurality of first sub-pixel units 10 including four diagonally disposed red sub-pixels 110, and with each of the plurality of second sub-pixel units 20 including four diagonally disposed green sub-pixels 210; and at least two second sub-pixel lines respectively located on two sides of the at least one first sub-pixel line, with each of the at least two second sub-pixel lines including a plurality of third sub-pixel units 30, with each of the plurality of third sub-pixel units 30 located between a first sub-pixel unit 10 and a second sub-pixel unit 20 adjacent to the first sub-pixel unit 10 in the column direction, with each of the plurality of third sub-pixel units 30 including two blue sub-pixels 310 arranged in the column direction. In the embodiment shown in FIG. 5, each of the first, second, and third sub-pixel units 10, 20, and 30 is substantially a regular hexagon.

A red sub-pixel 110, a green sub-pixels 210, and a blue sub-pixel 310, which are adjacent to each other and which are respectively of the at least one first sub-pixel line and the at least two second sub-pixel lines, form a pixel 2.

Figure 6:
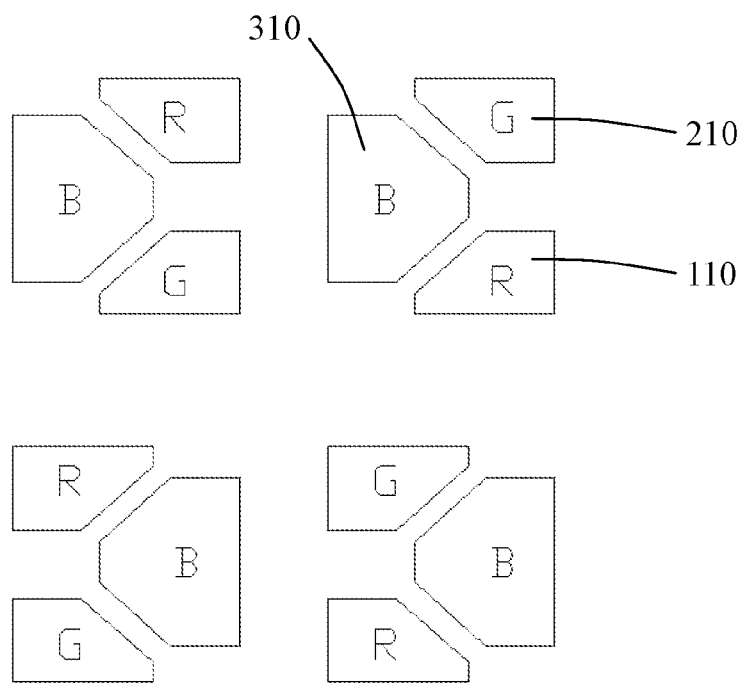
FIG. 6 is a diagrammatic view illustrating four combinations of a pixel of the pixel arrangement structure of FIG. 5.

With reference to FIG. 6, in the embodiment shown in FIG. 5, each pixel 2 of the pixel arrangement structure 1 includes a red sub-pixel 110, a green sub-pixels 210, and a blue sub-pixel 310. Furthermore, the red sub-pixel 110, the green sub-pixels 210, and the blue sub-pixel 310 of each pixel 2 together form a substantially slant T-shaped structure.

The present invention further provides a pixel arrangement structure for an organic light-emitting diode display including four pixel groups. Each of the four pixel groups includes a first sub-pixel, a second sub-pixel, and a third sub-pixel. The first, second, and third sub-pixels are arranged triangularly. The second pixels or the third sub-pixels of the four pixel groups are connected to each other. The first, second, and third sub-pixels have different colors. Preferably, the second sub-pixel or the third sub-pixels connected to each other together form a polygon having a plurality of even-numbered sides, preferably a quadrangle, a hexagon, or an octagon, more preferably a regular quadrangle, a regular hexagon, or a regular octagon. Thus, the arrangement between the sub-pixels of each sub-pixel unit can be more compact and matched.

Embodiment 3

Figure 7:
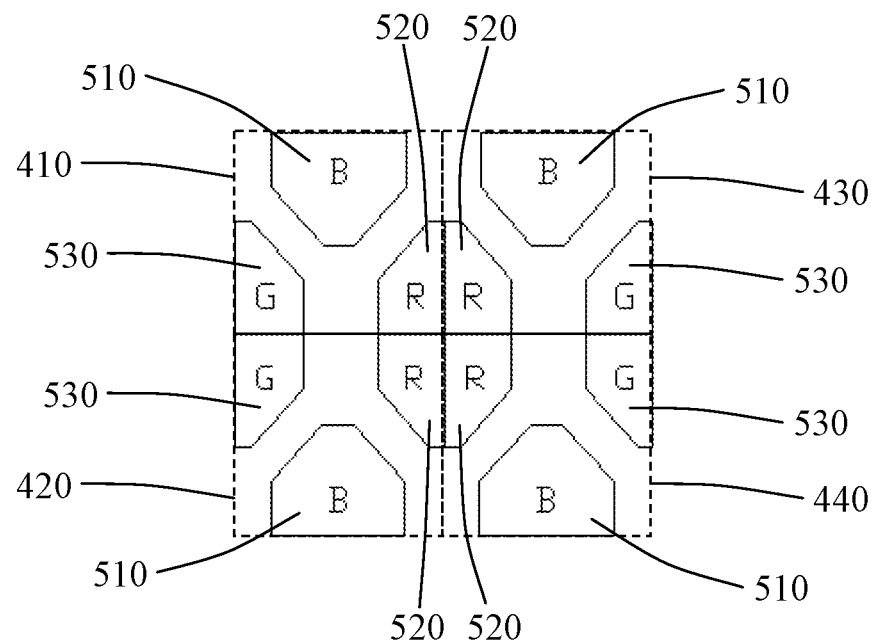
FIG. 7 is a diagrammatic view of a pixel arrangement structure for an organic light-emitting diode display of a third embodiment according to the present invention.

FIG. 7 is a diagrammatic view of a pixel arrangement structure for an organic light-emitting diode display of a third embodiment according to the present invention. As can be seen from FIG. 7, in this embodiment, the pixel arrangement structure for an OLED display includes four pixel groups. The four pixel groups includes a first pixel group 410, a second pixel group 420, a third pixel group 430, and a fourth pixel group 440. Each of the four pixel groups includes a first sub-pixel 510, a second sub-pixel 520, and a third sub-pixel 530. The first, second, and third sub-pixels 510, 520, and 530 are arranged triangularly. Preferably, each first sub-pixel 510 is a blue sub-pixel, each second sub-pixel 520 is a red sub-pixel, and each third sub-pixel 530 is a green sub-pixel.

When the second sub-pixels 520 of the four pixel groups are connected to each other, the third sub-pixels 530 of the first and second pixel groups 410 and 420 are connected to each other, and the third sub-pixels 530 of the third and fourth pixel groups 430 and 440 are connected to each other.

Fourth Embodiment

Figure 8:
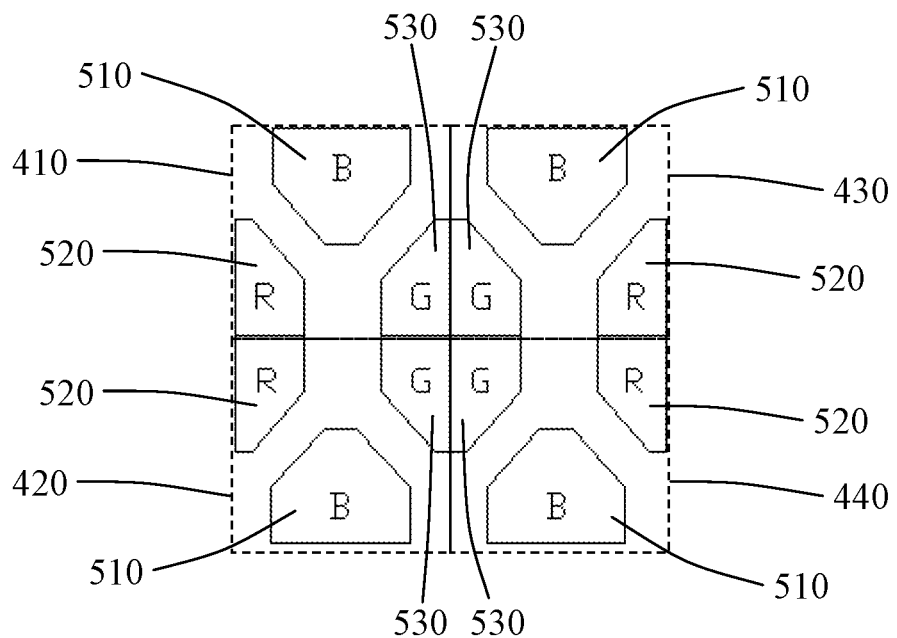
FIG. 8 is a diagrammatic view of a pixel arrangement structure for an organic light-emitting diode of a fourth embodiment according to the present invention.

FIG. 8 is a diagrammatic view of a pixel arrangement structure for an organic light-emitting diode display of a fourth embodiment according to the present invention. As can be seen from FIG. 8, in this embodiment, the pixel arrangement structure for an OLED display includes four pixel groups. The four pixel groups includes a first pixel group 410, a second pixel group 420, a third pixel group 430, and a fourth pixel group 440. Each of the four pixel groups includes a first sub-pixel 510, a second sub-pixel 520, and a third sub-pixel 530. The first, second, and third sub-pixels 510, 520, and 530 are arranged triangularly. Preferably, each first sub-pixel 510 is a blue sub-pixel, each second sub-pixel 520 is a red sub-pixel, and each third sub-pixel 530 is a green sub-pixel.

When the third sub-pixels 530 of the four pixel groups are connected to each other, the second sub-pixels 520 of the first and second pixel groups 410 and 420 are connected to each other, and the second sub-pixels 520 of the third and fourth pixel groups 430 and 440 are connected to each other.

Thus since the illustrative embodiments disclosed herein may be embodied in other specific forms without departing from the spirit or general characteristics thereof, some of which forms have been indicated, the embodiments described herein are to be considered in all respects illustrative and not restrictive. The scope is to be indicated by the appended claims, rather than by the foregoing description, and all changes which come within the meaning and range of equivalency of the claims are intended to be embraced therein.

The invention claimed is:

1. A pixel arrangement structure of an organic light-emitting diode display, comprising:
at least one first sub-pixel line comprising a plurality of first sub-pixel units and second sub-pixel units, each of the first sub-pixel units and second sub-pixel units arranged alternately in a first direction, wherein each of the first sub-pixel units comprises four red sub-pixels in matrix and four green sub-pixels in matrix; and
at least two second sub-pixel lines respectively arranged in two parallel sides of the first sub-pixel line, wherein each of the two second sub-pixel lines comprises a plurality of third sub-pixel units arranged in the first direction, and each of the third sub-pixel units is arranged between the one of the first sub-pixel units and one of the second sub-pixel units in a second direction which is vertical to the first direction, and each of the third sub-pixel units comprises two adjoined blue sub-pixels arranged in the second direction;
wherein a pixel unit is consisted by any three adjacent red sub-pixel, green sub-pixel and blue sub-pixel of the first sub-pixel line and one of the second sub-pixel lines.

2. The pixel arrangement structure for an organic light-emitting diode display according to claim 1, wherein the first direction is a column direction and the second direction is a row direction.

3. The pixel arrangement structure for an organic light-emitting diode display according to claim 1, wherein the first direction is a row direction and the second direction is a column direction.

4. The pixel arrangement structure for an organic light-emitting diode display according to claim 1, wherein each of the plurality of first sub-pixel units, the plurality of second sub-pixel units, and the plurality of third sub-pixel units is a polygon having a plurality of even-numbered sides.

5. The pixel arrangement structure for an organic light-emitting diode display according to claim 4, wherein each of the plurality of first sub-pixel units, the plurality of second sub-pixel units, and the plurality of third sub-pixel units is quadrangular.

6. The pixel arrangement structure for an organic light-emitting diode display according to claim 4, each of the plurality of first sub-pixel units, the plurality of second sub-pixel units, and the plurality of third sub-pixel units is hexagonal.

7. The pixel arrangement structure for an organic light-emitting diode display according to claim 4, each of the plurality of first sub-pixel units, the plurality of second sub-pixel units, and the plurality of third sub-pixel units is octagonal.

8. The pixel arrangement structure for an organic light-emitting diode display according to claim 1, wherein each of the plurality of first sub-pixel units, the plurality of second sub-pixel units, and the plurality of third sub-pixel units is elliptic.

9. The pixel arrangement structure for an organic light-emitting diode display according to claim 1, wherein each of the plurality of first sub-pixel units, the plurality of second sub-pixel units, and the plurality of third sub-pixel units is circular.

* * * * *